United States Patent [19]

Mitwalsky et al.

[11] Patent Number: 5,766,497
[45] Date of Patent: Jun. 16, 1998

[54] ABLATION PATTERING OF MULTILAYERED STRUCTURES

[75] Inventors: Alexander Mitwalsky, Poughkeepsie, N.Y.; James Gardner Ryan, Newtown, Conn.; Thomas Anthony Wassick, Wappingers Falls, N.Y.

[73] Assignees: Siemens Aktiengesellschaft, Munich, Germany; International Business Machines Corporation, Armonk, N.Y.

[21] Appl. No.: 829,370

[22] Filed: Mar. 31, 1997

Related U.S. Application Data

[62] Division of Ser. No. 414,241, Mar. 31, 1995.

[51] Int. Cl.$^6$ .............................. B44C 1/22; H01L 21/00
[52] U.S. Cl. ........................... 216/56; 216/62; 216/65; 216/66; 438/690
[58] Field of Search ............................ 438/690, 708, 438/725, 723, 724, 737, 738; 216/56, 65, 66, 62, 72, 76

[56] References Cited

U.S. PATENT DOCUMENTS

| | | | |
|---|---|---|---|
| 5,302,547 | 4/1994 | Wojnarwski et al. | 438/690 X |
| 5,505,320 | 4/1996 | Burns | 216/65 X |

*Primary Examiner*—William Powell
*Attorney, Agent, or Firm*—Dexter K. Chin

[57] ABSTRACT

A process for ablation etching through one or more layers of dielectric materials while not etching an underlying conductive material layer comprises selecting parameters whereby the ablation process automatically stops when the conductive material layer is reached, or monitoring the process for end point detection of the desired degree of ablation. Parameters selected are the absorptivity of the dielectric layer versus that of the conductive material layer. End point detection comprises monitoring radiant energy reflected from the workpiece or the content of the materials being ablated from the workpiece.

3 Claims, 1 Drawing Sheet

5,766,497

1
ABLATION PATTERNING OF MULTILAYERED STRUCTURES

This is a divisional of application Ser. No. 414,241 filed Mar. 31, 1995.

BACKGROUND OF THE INVENTION

This invention relates to ablation patterning, and particularly to the selective patterning of one or more dielectric layers overlying a conductive material body.

The use of ablation patterning of various polymeric materials, e.g., polyimides, is known. U.S. Pat. No. 4,508,749 to Brannon et al. (Apr. 2, 1985), for example, discloses the use of ultraviolet (U.V.) radiation for etching through a polyimide layer. This patent is primarily directed to producing tapered openings through a polyimide layer for exposing surface areas of an underlying layer of metal. Electrical connections are then made through the openings to the metal layer. U.S. Pat. No. 5,236,551 to Pan (Aug. 17, 1993) likewise uses ablation etching for patterning a polymeric material layer which is then used as an etch mask for etch patterning, using wet or chemical etchants, an underlying layer of metal.

In a typical ablation process, a beam of laser energy is directed against an exposed surface of a body to be ablated. The laser energy is absorbed by the material and, as a result of photochemical, thermal and other effects, localized explosions of the material occur, driving away, for each explosion, tiny fragments of the material. The process requires that significant amounts of energy be both absorbed and retained within small volumes of the material until sufficient energy is accumulated in each small volume to exceed a threshold energy density at which explosions occur.

Polymeric materials, such as polyimides, are well suited for use in the process because such materials have a high absorptivity for U.V. light while having a relatively low thermal diffusivity for limiting the spread of the absorbed energy away from the volume where the energy was absorbed. Thus, the energy level quickly builds above the required energy density threshold.

In both the above-cited patents, polymeric layers overlying a layer of metal are ablated. Metals, such as aluminum, copper and the like, typically have a relatively low absorptivity for U.V. light as well as a relatively high thermal diffusivity. Accordingly, when the ablation of the overlying polymeric layer proceeds entirely through the polymeric layer, the process automatically stops. This occurs because while the energy density provided by the laser beam is sufficient to ablate the material of the polymeric layer, it is far too small to ablate the metal layer. Within the metal layer, only relatively small amounts of the incident radiant energy are absorbed per unit volume, and what energy is absorbed tends to quickly dissipate into the surrounding volumes. Obviously, ablation can occur provided the energy density of the laser beam is sufficiently high.

While not disclosed in the afore-cited patents, it would also be desirable in many instances to be able to ablation etch dielectric materials other than the polymeric materials disclosed in the patents. In the manufacture of semiconductor devices, for example, hard passivation materials such as silicon dioxide and silicon nitride are extensively used and, sometimes, in combination with certain polymer materials, particularly polyimides.

A problem with ablation etching of such other dielectric materials, however, is that they tend to have a low absorptivity and require radiant energy densities far greater than

2 those needed for ablation of polymeric materials. Additionally, the magnitudes of the radiant energy densities required for such other dielectric materials approach those required for the ablation etching of various metals. A problem thus created is that of obtaining selectivity of the ablation process; that is, providing ablation etching of only selected layers in a multi-layered structure while not etching non-selected layers. This problem is solved by this invention.

SUMMARY OF THE INVENTION

A multi-layered structure comprising one or more dielectric layers overlying a conductive material layer is ablation etched for providing a pattern of aligned openings through the dielectric layer or layers for exposing unablated surface portions of the conductive material layer.

In one embodiment, the uppermost dielectric material layer is a polyimide overlying a layer of silicon dioxide or silicon nitride, or layers of both. Ablation etching is performed first through the polyimide layer and then through the underlying silicon dioxide and/or silicon nitride layer(s) with the process stopping at the conductive material layer.

In another embodiment, high energy densities are used to penetrate the silicon dioxide and/or silicon nitride layer(s), and end point detection means are used to stop the process when the conductive material layer is reached.

In a further embodiment, the absorptivity of the silicon dioxide and/or silicon nitride layer(s) is increased by the addition of a "darkening" agent, thereby lowering the threshold energy for ablation of the layer or layers to well below that of the conductive material layer.

In a still further embodiment, an ablating radiant energy wavelength is selected providing for higher absorptivity of the radiation within the layer(s) to be ablated than in conductive material layer.

Preferably, in both the further and still further embodiments, the absorptivity of the dielectric layers used in combination with a polyimide dielectric layer is made so high that a single ablation process can be used for all the dielectric layers.

DESCRIPTION OF THE DRAWING

The figures are schematic and not drawn to scale.

DESCRIPTION OF PREFERRED EMBODIMENTS OF THE INVENTION

Figure 1:
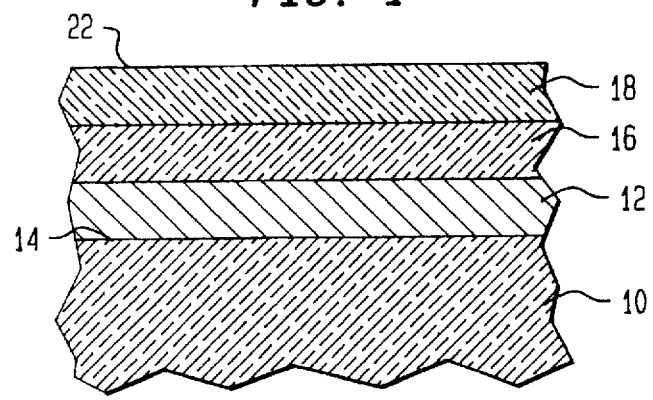
FIG. 1 is a cross-sectional view of a multi-layered workpiece with which the invention has utility.

FIG. 1 shows an example of a multi-layered structure with which the present invention has utility.

The structure includes a substrate 10 of, e.g., a semiconductor material such as silicon; a layer 12 of metal, e.g., aluminum, overlying a surface 14 of the substrate; a first layer 16 of a dielectric material, e.g., silicon nitride or silicon dioxide; and a covering layer 18 also of a dielectric material, e.g., a polymer material, particularly a polyimide.

In accordance with the invention, the top two dielectric layers 16 and 18 are to be ablation etched with little or no etching of the underlying metal layer 12.

As previously mentioned, ablation etching of polymeric materials, such as various polyimides, is known and described in the afore-cited patents to Brannon et al. and Pan. Accordingly, for ablation etching entirely through the polymeric upper layer 18 an ablation process identical to the various processes described in the patents can be used.

By way of example, U.V. laser radiant energy having a wavelength of 308 nm or 266 nm (produced by commercially available lasers), is directed onto the surface 22 of the upper layer 18. A pattern of openings 26 (FIG. 2) is to be made entirely through the layer 18, and, to this end, the laser light is directed through a photomask containing the desired pattern of openings to be formed. The light passing through the photomask is focused onto the surface 22 of the upper layer 18. Details of the laser light imaging system are not shown, as being well known. An example of a suitable system is shown in the Brannon ('749) patent.

As previously mentioned, polymeric materials are well suited for being ablated by radiant energy, and relatively low energy densities are required, e.g., around 200 MJ/cm$^2$ per pulse of energy. Each energy pulse has a width of around 20 ns and a repetition rate of from 200 Hz to 20 K Hz. Typically, etching proceeds at a rate of around 0.1 um/pulse for polyimide.

Figure 2:
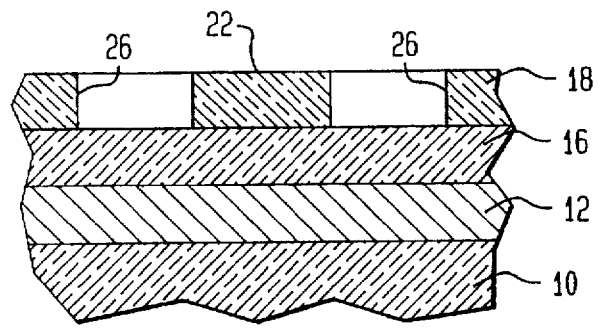
FIGS. 2 and 3 are views similar to that of FIG. 1 but showing the workpiece at successive processing stages.

FIG. 2 shows openings 26 formed entirely through the polymeric layer 18. At this point, the ablation process automatically ceases even with continued irradiation of the workpiece. The reason for this is that the threshold energy densities for commonly used dielectric materials such as silicon dioxide and silicon nitride are significantly greater than that needed for polymeric materials. Thus, rather than the energy density of around 200 mJ/cm$^2$ as in the above illustrative example, energy densities of around 600 MJ/cm$^2$ are typically required for he ablation of silicon nitride and silicon dioxide layers (an exception to this is hereinafter described).

In accordance with one aspect of the present invention, after the openings 26 through the layer 18 are formed, the energy density of the irradiating energy laser beam is increased to that amount necessary to ablation etch through the dielectric layer 16.

In some instances, obtaining sufficiently high energy densities over the entire surface of the workpiece (e.g., a three inch diameter silicon wafer) can be difficult using commercially available lasers and optical systems, and one solution in such case is to scan a relatively small diameter, high energy density laser beam over the surface of the photomask. In one arrangement, the laser beam is raster scanned over the photomask. In another arrangement, the laser beam is stationary with respect to a photomask, and the image projected through the photomask is stepped across the wafer surface using known step and repeat technology.

Figure 3:
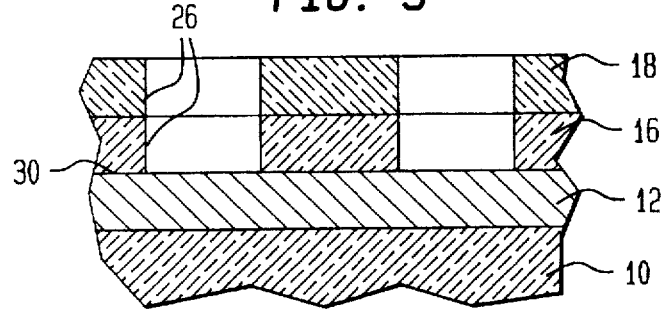

FIG. 3 shows the openings 26 through the polymeric material layer 18 extended through the layer 16. While a feature of the invention is the ablation etching of a pattern of openings through successive layers (rather than the use of two separate types of etching as shown in the Pan patent), the invention also has utility where the overlying polymeric material layer 18 is omitted. That is, the ablation process described would begin with the layer 16 shown in FIG. 1.

The dielectric material layer 16 directly overlies a layer 12 of metal, e.g., aluminum. The layer 12 can comprise other metals, e.g., copper, doped polycrystalline silicon and the like. Of significance is that with the use, as previously described, of high energy densities for ablating through the dielectric layer 16, a problem exists of stopping the ablation process at the surface 30 of the underlying layer 12. This is accomplished in a number of different ways as follows.

The ablation process involves directing U.V. radiation at the workpiece. Some of the radiation is reflected and the amount of such reflection is a function of the surface against which the radiation is directed. Thus, by detecting and monitoring the radiation reflected from the workpiece, end point detection of the ablation process is possible. Specifically, when the openings 26 penetrate entirely through the dielectric layer 16 and first begin to expose the underlying metal layer surface 30, a significant change in the reflected energy occurs which is a signal for immediately discontinuing the ablation process. Using known optical, radiation detecting and computer systems, extremely fast reaction times are possible whereby, even with relatively rapid ablation rates through the dielectric layer 16 (for high manufacturing rates), precise control and minimal etching of the metal layer 12 is possible.

In general, the amount of reflected radiation varies as the openings 26 proceed through the dielectric layer and get closer to the metal layer. Then, when the openings through the layer 16 are complete, thereby exposing the metal layer 12, the amount of reflected radiation will thereafter tend to remain constant. The change from a varying to a constant detected signal level provides a strong signal, independent of varying conditions from device to device and from time to time, for stopping the ablation process.

Another end point detection scheme is to perform the ablation process in a vacuum chamber (generally desirable for control of the process and the avoidance of oxidizing the uncovered metal layer) and to monitor the material being exploded from the workpiece. For example, when the material of the layer 12 is first detected, the process is discontinued.

The foregoing described processes involve the use of relatively high energy densities and end point detection for stopping the ablation process. An alternative approach is to reduce the required energy densities for the dielectric layer 16 well below that of the metal layer 12 whereby automatic stopping of ablation occurs when the metal layer is reached. To the extent that the energy densities can be sufficiently reduced, it is possible to use but a single ablation process for both the polymeric layer 18 and an underlying layer 16.

One means for accomplishing ablation at reduced energy densities is to increase the absorptivity of the material by adding, in effect, "darkening" agents thereto, such as carbon and fluorine. The dielectric materials must, of course, be electrically non-conductive, and the quantity of added material, if electrically conductive, as is carbon, is preferably small enough so as not to significantly degrade the dielectric qualities of the material.

Another means for obtaining selectivity of the ablation process turns upon the fact that the absorptivity of radiation of various materials is a function of the wavelength of the radiant energy. Accordingly, for providing greater selectivity in the ablation process, a wavelength is selected providing a higher absorptivity in the dielectric layer than in the underlying metal layer.

Figure 4:
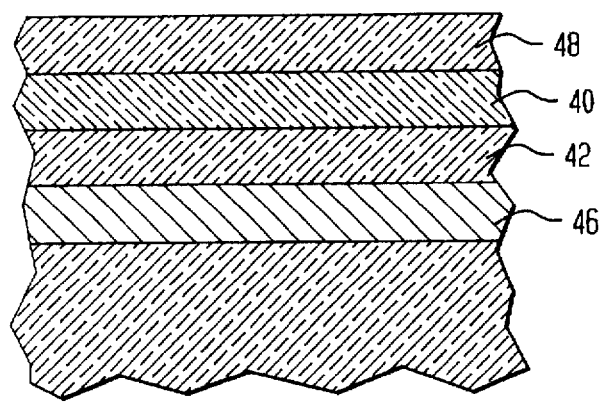
FIG. 4 is a view similar to that of FIG. 1 but showing another multi-layered workpiece.

FIG. 4 shows a specific example of one type of structure with which the present invention has utility. Herein, two dielectric layers 40 and 42 are disposed overlying a layer 46 of metal, e.g., aluminum or doped polycrystalline silicon. The layer 42 is of silicon dioxide and the layer 40 is of silicon nitride. A layer 48 of polyimide covers the entire structure. In accordance with the invention, a pattern of openings are ablated entirely through the three layers 48, 40 and 42 for exposing a surface portion of the metal layer 46.

Additional arrangements according to the invention are now described.

End point detection is achieved by:

Optical Emission: The emission generated by the ablation process is monitored with a spectrometer, focusing on emission specific to the materials in use. The characteristics of the emission change depend on the materials being ablated, and the termination of the final oxide/nitride signal in the emission spectrometer is an excellent indicator of completed etching. By feeding back this information to the laser ablation tool, etching can be terminated without degradation of the underlying metal film.

Reflectivity: Changes in the reflectivity of the surface being ablated can be monitored by reflecting a laser beam(s) (normally He—Ne) from the surface at an angle, and monitoring the intensity of the reflected beam with a photodetector. Each material being ablated will have a characteristic reflectance spectra. For example, the underlying metal reflects the probe laser beam at a much higher level than from the insulators. Detecting the signal increase when the dielectric is removed, exposing the metal, is used to stop the process.

Ion Emission: The ions coming from the surface can also be collected and analyzed with appropriate detection electronics. By monitoring this emission for the presence or absence of metal ions, appropriate end-point feedback is provided.

Process Control: If the insulating films have good uniformity in thickness over the surface area being ablated, the process can be controlled by the number of laser shots. Since the etch rate of the films can be determined as a function of laser parameters, the number of shots required to completely, remove the film can be calculated precisely. This allows removal of the dielectric without impacting the underlying metal film.

Reductions in the energy thresholds required for ablation of dielectric materials are also achievable by modifying the deposition conditions thereof for producing lower density films. Such lowering of film density reduces the number of chemical bonds that need to be broken, hence reduces the amount of ablation energy required.

In connection with the aforementioned wavelength selection for improving selectivity, it is noted that lower laser wavelengths are more efficiently absorbed by the dielectrics, permitting effective etching at lower laser powers. For example, the laser power required to remove an equivalent amount of oxide or nitride is lower at 193 nm than at 308 nm. In the same range, the efficiency of metal removal changes only slightly, so shorter wavelengths improve process selectivity.

What is claimed is:

1. A process for patterning a multi-layered workpiece comprising the steps of providing a first layer of a dielectric material on a surface of an electrically conductive body, providing a second layer of a polymeric material overlying said first layer, ablation etching a pattern of openings through both said first and second layers for exposing surface portions of said body through said openings, and, prior to said ablation etching step, doping said first layer for providing it with an absorptivity for radiant energy used in said ablation step in excess of the absorptivity for said energy by said conductive body.

2. A process according to claim 1 wherein said first layer material is selected from the group consisting of silicon oxide and silicon nitride.

3. A process according to claim 1 including performing said doping in a manner substantially preserving the dielectric characteristics of said first layer.

* * * * *